United States Patent [19]

Gazdik et al.

[11] 4,231,154
[45] Nov. 4, 1980

[54] ELECTRONIC PACKAGE ASSEMBLY METHOD

[75] Inventors: Charles E. Gazdik, Endicott; Donald G. McBride, Binghamton, both of N.Y.

[73] Assignee: International Business Machines Corporation, Armonk, N.Y.

[21] Appl. No.: 2,473

[22] Filed: Jan. 10, 1979

[51] Int. Cl.$^3$ .................... H05K 3/06; H05K 3/10; H05K 3/34
[52] U.S. Cl. ..................... 29/840; 29/842; 29/847; 357/75; 357/80
[58] Field of Search ............. 29/625, 589, 628, 626, 29/840, 842, 847; 174/68.5; 357/74, 79, 80, 81

[56] References Cited

U.S. PATENT DOCUMENTS

| | | | |
|---|---|---|---|
| 3,387,365 | 6/1968 | Stelmak | 29/626 X |
| 3,488,840 | 1/1970 | Hymes et al. | 29/628 X |
| 3,777,220 | 12/1973 | Tatusko et al. | 357/80 X |
| 3,868,724 | 2/1975 | Perrino | 357/80 X |
| 4,074,342 | 2/1978 | Honn et al. | 357/74 X |

OTHER PUBLICATIONS

Solid State Tech., Nov. 1969, pp. 31ff, Art by Cannizzaro.
Electronics, Feb. 16, 1970, pp. 116ff, Art. by Grurninger.
IBM Tech. Discl. Bull., vol. 17, No. 7, Dec. 1974, pp. 2018ff, by Liv et al.
IBM Tech. Discl. Bull., vol. 20, No. 8, Jan. 1978, pp. 3020ff, by Abolafia et al.

Primary Examiner—Francis S. Husar
Assistant Examiner—C. J. Arbes
Attorney, Agent, or Firm—Norman R. Bardales

[57] ABSTRACT

A method for making an electronic package assembly of the type having an insulator pin carrier, a thin, i.e. substantially five microns, flexible printed circuit (PC) polyimide member having printed circuit conductors bonded to the heads of the pins of the carrier, and one or more integrated circuit (IC) chips with a high density (i.e. 100 or more) input/output I/O terminal array on the bottom surface of each chip bonded to a corresponding registerable array of PC conductor pads of the polyimide member. The forming, curing and circuitizing of the polyimide member, the bonding of the I/O terminals to the pads of the PC member, and the bonding of the pin heads to the PC member are done on a temporary support or fixture. The method provides a reliable manner for fabrication of the package assembly which minimizes the risk of destroying the flexibility of the PC member and/or its integrity during the making of the assembly and/or the subsequent thermal cycling associated with the assembly.

10 Claims, 17 Drawing Figures

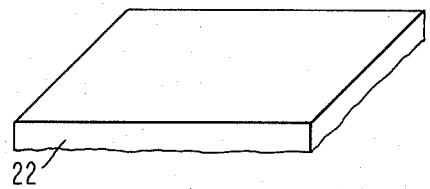
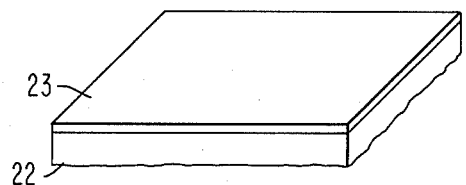
FIG. 4A  FIG. 4B
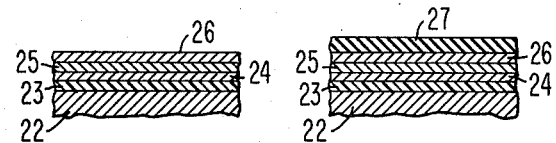
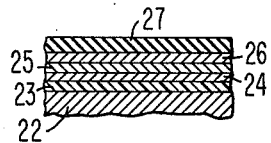
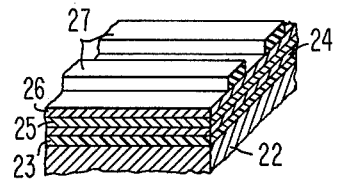
FIG. 4C  FIG. 4D  FIG. 4E
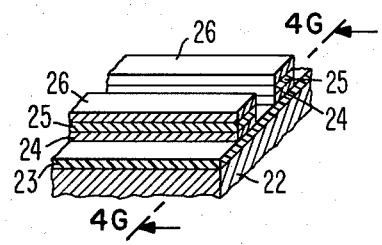
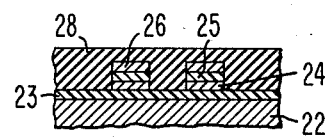
FIG. 4F  FIG. 4G
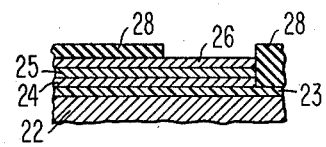
FIG. 4H
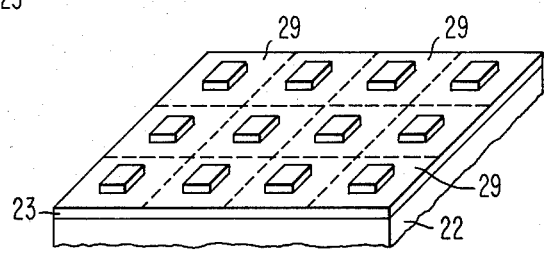
FIG. 5
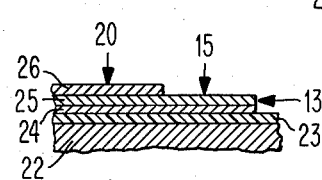
FIG. 4I

ELECTRONIC PACKAGE ASSEMBLY METHOD

BACKGROUND OF THE INVENTION

1. Field of the Invention

This invention relates to electronic packaging and more particularly to a method of making electronic packages which require a thin flexible printed circuit polyimide substrate of substantially five microns.

2. Description of the Prior Art

U.S. Pat. No. 3,780,352, FIG. 4, is an example of an electronic package assembly in which a thin sheet of insulating material, which supports thin metallic film strips, is positioned intermediate between a semiconductor device mounted thereon and a pin carrier of ceramic. The metallic film strips are bonded to the heads of the pins of the carrier and the contact pads of the semiconductor device.

Also, in the prior art of which we are aware, the formation of thin flexible polyimide printed circuit (PC) tapes have been generally heretofore limited to thicknesses of 0.5 to 3 mils, cf. U.S. Pat. No. 3,781,596, for example.

Because of the thermal mismatch between the pin carrier, PC member and/or semiconductor device, the bonds between the PC member and the pads of the semiconductor device and/or the heads of the pins are subject to stresses which cause failure of the bond joint and, hence, failure of the packaged device. These stresses may be caused, for example, by thermal cycling such as that encountered under a test environment used to test the packages or under actual environmental conditions during the operation of the package when installed in service in some circuit application.

It has been suggested that the PC member itself act as a strain relief to relieve the aforesaid stresses. However, the thicknesses of the prior art members were not amenable to providing the degree of flexibility required to accomplish the desired result. Moreover, the temperatures and/or pressures associated with the making of the PC member and/or the bonding at the IC pad sites and/or at the pin sites would stiffen the polyimide material at the vicinity of the sites. Thus, the flexibility of the polyimide material at the bonding sites was destroyed or lost so that it could not effect a satisfactory strain relief. With the advent of high density (i.e. 100 or more) input/output (I/O) terminal pad devices, the problem became even more acute. Moreover, the problem is even further compounded when the chip is rigidly affixed to another structural member such as is the case, for example, when the chip is backbonded to the cover of the assembly or an intervening thermal conductive member for enhancing the heat sinking, i.e. dissipation, of the heat associated with the chip and/or assembly.

SUMMARY OF THE INVENTION

It is an object of this invention to provide a method for making an electronic package assembly of the type which employs a thin polyimide flexible PC substrate which minimizes the risk of destroying the flexibility and/or integrity of the polyimide material.

Another object of this invention is to provide a method for making the aforesaid assembly with IC devices having high density (i.e. 100 or more) I/O terminal arrays.

Another object of this invention is to provide a method for making the aforesaid assembly with a polyimide substrate of substantially five microns $\simeq$ to 0.2 mils.

Still another object of this invention is to provide an aforesaid method amenable to batch processing.

According to one aspect of the invention there is provided a method for making at least one electronic package assembly. The assembly is of the type having at least an insulator pin carrier member, plural conductive elongated pluggable pins carried by the member, and a thin flexible printed circuit member. Moreover, in the assembly, each of the pins extends through the insulator member to provide first and second extensions past first and second surfaces, respectively, of the insulator member. Furthermore, in the assembly, the thin flexible printed circuit member has a polyimide substrate of a predetermined thickness of substantially 5 microns, and a printed circuit pattern of plural conductors supported by the substrate. In the assembly, the first extensions are bonded to predetermined ones of the plural conductors. In addition, the assembly has at least one electronic circuit chip with its input/output terminals bonded to preselected ones of the plural conductors. The method comprises the steps of providing temporary planar support means, forming an integral layer of uncured liquid polyimide on one surface of the support means sufficient to provide the predetermined thickness when the polyimide is subsequently cured, curing the polyimide layer, circuitizing the outer surface of the cured polyimide layer with the predetermined circuit pattern, bonding the terminals of the chip to the aforementioned preselected ones of the conductors, selectively removing portions of the temporary support means from the polyimide layer, and bonding the first extensions of the pins to the aforementioned predetermined ones of the plural conductors.

The foregoing and other objects, features and advantages of the invention will be apparent from the following more particular description of a preferred embodiment of the invention, as illustrated in the accompanying drawing.

BRIEF DESCRIPTION OF THE DRAWING

FIGS. 4A–4B are perspective views illustrating certain stages of the preferred method embodiment of the present invention associated with fabricating the polyimide member of FIG. 1;

FIGS. 4C–4D are enlarged partial cross-sectional views illustrating certain stages of the preferred method embodiment associated with fabricating the printed circuit conductor pattern on the polyimide member of FIG. 1;

FIGS. 4E–4F are enlarged partial perspective views, shown in cross-section, illustrating certain further stages of the preferred method embodiment associated with fabricating the aforesaid pattern;

FIG. 4G is an enlarged partial cross-section view, as viewed along the line 4g—4g of FIG. 4F, illustrating still another further stage of the preferred method embodiment associated with fabricating the aforesaid pattern;

FIGS. 4H and 4I are enlarged partial cross-sectional views illustrating still further stages of the preferred method embodiment associated with fabricating the aforesaid pattern;

FIG. 5 is a perspective view illustrating the stage of the preferred method embodiment associated with the chip attachment to the aforesaid pattern.

In the figures, like elements are designated with similar reference numbers.

DESCRIPTION OF THE PREFERRED EMBODIMENT

Figure 1:
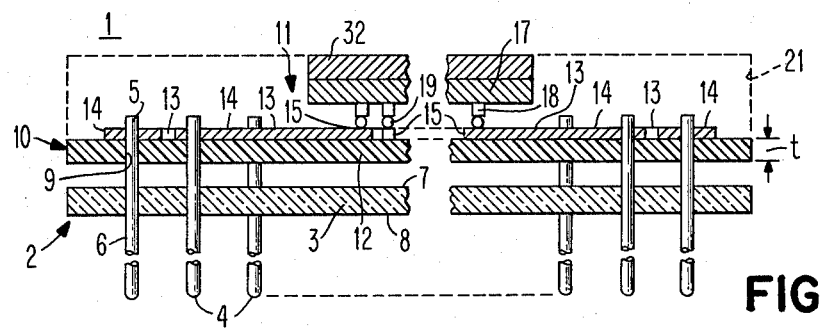
FIG. 1 is a schematic cross-sectional view, partially broken away for sake of clarity, illustrating an electronic package assembly made in accordance with the principles of the present invention.

Referring to FIG. 1, there is shown in schematic form for sake of clarity a cross-sectional view of the type of electronic package assembly, which is generally indicated by the reference number 1, that is made in accordance with the principles of the present invention. More particularly, assembly 1 has a pin carrier member generally indicated by the reference number 2. The member 2 has a planar rectangular insulator, e.g. ceramic base 3 and plural conductive pins 4. Pins 4 are embedded in base 3 around its periphery and are arranged in two concentric rectangular arrays so as to form two parallel rows of aligned pins 4 on each edge of the base 3. Each of the embedded pins 4 extends through base 3 to provide respective first and second extensions generally indicated by respective reference numbers 5 and 6 above the top and bottom surfaces 7 and 8, respectively, of base 3. The shorter extensions 5 are hereinafter referred to as the heads. The longer extensions 6 are the parts that are adapted to be plugged into some compatible mating female connectors or receptacles, not shown.

Heads 5 are passed through apertures or openings 9 of a thin flexible printed circuit member 10. Member 10 has a printed circuit conductor pattern generally indicated by reference number 11 on its polyimide substrate 12. In accordance with the principles of the present invention, the substrate 12 has a thickness t of substantially five microns. Printed circuit pattern 11 has a plurality of conductors, e.g. conductors 13, apertured lands 14 and pads 15, cf. FIG. 2. Predetermined ones of the conductors are terminated in lands 14, each of which is concentric with one of the apertures 9 and is bonded to the head 5 of the particular pin 4 passed therethrough by suitable bonding means, e.g. solder 16, cf. FIG. 2. In a similar manner, preselected ones of the conductors 13 are terminated in pads 15, cf. FIG. 2. It should be understood that in most applications two ends of most of the conductors 13 are terminated with a land 14 and pad 15, respectively. However, each of certain ones of the conductors 13 can be terminated on two of its ends with lands 14 to effect certain intraconnections of the pins 4, if desired.

Figure 2:
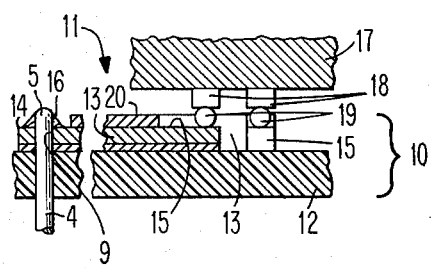
FIG. 2 is an enlarged partial cross-sectional view taken along the lines 2—2 of FIG. 3 and illustrating certain details of the assembly of FIG. 1.
Figure 3:
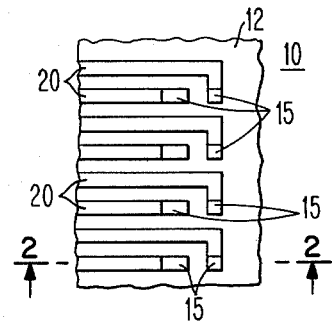
FIG. 3 is a partial planar view of the flexible printed circuit member of the assembly of FIG. 1.

Mounted on member 10 is at least one integrated circuit semiconductor device or chip 17 which has on its active surface a plurality of input/output terminals 18, as shown in greater detail in FIG. 2. Terminals 18 are arranged in a predetermined array and the array is preferably a high density type, i.e. 100 or more terminals 18. Pads 15 on base 3 are arranged in a compatible array, cf. FIG. 3, which is in aligned register with the terminal array of device 17. It should be understood that each of some of the conductors 13 can be terminated on two of its ends with pads 15 to effect intra-connection between terminals 18 of the same chip 17, or interconnection between respective terminals 18 of two chips 17 in those cases where more than one chip 17 is mounted on member 10. In the preferred embodiment, a controlled collapse chip connection process, referred to in the art as C-4, bonds the I/O terminals 18 to their associated pads 15 via reflow solder connectors 19, which are prefixed to the terminals 18. Preferably, pads 15, as well as lands 14 have been presoldered to facilitate bonding of the terminals 18 and pin heads 5, respectively, thereto. Preferably, a suitable solder stop 20 is located on each respective conductor 13. It covers the conductors 13 except at the bonding sites of lands 14 and pads 15 and thus prevents the solder flow of solder 16 and connector 19 from moving away from the particular land 14 or pad 15. For sake of clarity, the respective arrays of terminal 18 and pads 15 of members 17 and 10, respectively, are only partially shown in the figures. Assembly 1 is hermetically sealed within a suitable module container or cover 21 shown schematically in dash outline form in FIG. 1 for sake of clarity. Pins 4 protrude from container 21 so as to be cooperatively engageable with their mating receptacles, not shown. In accordance with the principles of the present invention, the preferred embodiment for making the electronic package assembly 1 will next be described with reference to FIGS. 4A–6D.

A temporary planar support 22, FIG. 4A, is provided. For batch processing, the support 22 is in the form of a panel. The support 22 is made of a removable material. In the preferred method, support 22 is preferably an etchable material such as aluminum, invar, Kovar ® (registered trademark of Westinghouse Electric Corp.) or the like. Support 22 is pre-cleaned and polished. An integral layer 23 of uncured liquid polyimide is formed on a surface of support 22, cf. FIG. 4B. The layer 23 is cast on support 22, preferably by spraying, to a thickness which is compatible to achieve the desired thickness t of substantially five microns when the polyimide layer 23 is subsequently cured. A polyimide suitable for layer 23 is manufactured by DuPont de Nemours, E. I. and Co., under the product name of DuPont Polyimide 5057.

Prior to curing, the uncured polyimide liquid layer 23 is dried. In the preferred embodiment, the drying takes place approximately at a temperature of 125° C. for 15 minutes. The layer 23 is next cured. In the preferred embodiment this occurs approximately at an elevated temperature of 350° C. for approximately 5 minutes.

The next phase of the process involves the formation of the printed circuit patterns 11 on the polyimide layer 23 at the different package assembly sites thereof. To this end, in the preferred embodiment successive integral layers 24, 25, 26 of chromium, copper and chromium, respectively, are applied by conventional evaporation processes on the planar surface of the cured polyimide layer 23, FIG. 4C. Chromium layer 24 provides improved adherence for the copper layer 25 than would be the case if layer 25 were to be directly evaporated to the polyimide layer 23. Chromium layer 26 is used for form the solder stops 20 as hereinafter explained. Next, an integral layer 27 of a suitable photoresist, such as for example, the photoresist manufactured by Eastman Kodak Co. under the product name of KTFR, is applied to the outer surface of layer 26 and then exposed through a mask, not shown, containing the desired PC pattern image, cf. FIG. 4D. The photoresist layer 27 is then developed in a suitable developer. Thus, for the given KTFR photoresist example a KTFR developer is used. As a result, the remaining photoresist of layer 27 is left as an etchant mask with the configuration of the desired PC patterns 11 of conductors 13, cf. FIG. 4E.

Thereafter, the excess chromium and copper of layers 24–26 not covered by the photoresist mask formed by layer 27 are successively etched by suitable etchants. More specifically, in the given embodiment, the chromium layer 26 is first etched with an etchant mixture of potassium permaganate/potassium hydroxide. Next, the copper layer 25 is etched with an etchant of ferric chloride, followed by the etching of chromium layer 24 with an etchant of the same type of the aforementioned mixture used to etch layer 26. Layers 24–27 now contain the desired PC conductor patterns 11. The photoresist mask formed from layer 27 is then removed, i.e. stripped, with a conventional stripper and the layers 24–26 rinsed in an appropriate rinse, as is well-known to those skilled in the art, cf. FIG. 4F.

A second photoresist layer 28 of the same type used for layer 27 is next applied to the exposed surfaces of the upper layers 23–26, cf. FIG. 4G. Layer 28 is used to form an etchant mask associated with making the solder stops 20. Layer 28 is exposed through another suitable mask, not shown, which contains the desired chromium solder stop pattern associated with lands 14 and pads 15. Layer 28 is then developed in a suitable developer of the same type used to develop layer 27. As a result, layer 28 is removed from atop the regions of chromium layer 26 that are co-extensive with the regions of copper layer 25 that form the lands 14 and pads 15, cf. FIG. 4H. The chromium of layer 26 which covers lands 14 and pads 15 of layer 25 is then etched in an etchant of the type such as, for example, the aforementioned mixture of potassium permaganate/potassium hydroxide. As a result, the remaining chromium of layer 26 forms the aforementioned stops 20 which acts as a solder barrier stop for the rest of the printed circuit pattern 11 covered thereby. Thereafter the photoresist mask formed from layer 28 is removed, cf. FIG. 4I, in a manner similar to that used to remove the photoresist mask of layer 27. The polyimide layer 23 is now circuitized with the printed circuit patterns 11.

Alternatively, the chromium layer 26 is removed from the top of lands 14 and pads 15 prior to the formation of the circuit lines. This allows the two associated photoresist layers to be applied to a more uniform surface.

In the next phase of the process, the semiconductors 17, which have the solder balls 19 preaffixed to its I/O terminals 18 as aforementioned, are mounted to the circuitized polyimide layer 23 at each of the package assembly sites generally indicated by the reference numbers 29, cf. FIG. 5. As aforementioned, lands 14 and pads 15 have been pretinned by a conventional solder wave process. As also aforementioned, a C-4 process is used to bond the spheres 19 and, hence, terminals 18 to their respective associated pads 15. For sake of explanation and clarity, in FIG. 5 only one chip 17 is shown mounted in each of the sites 29, it being understood that plural chips 17 can be mounted at one site as is obvious to those skilled in the art. In FIGS. 5 and 6A–6D, the printed circuit patterns 11 and/or terminals 18 are omitted, for sake of clarity.

Figure 6A:
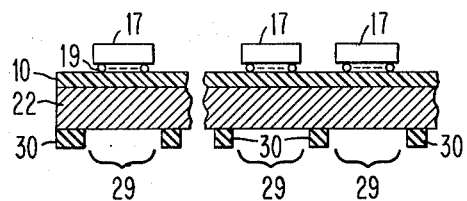
FIGS. 6A–6D are cross-sectional views illustrating the stages of the preferred method embodiment associated with attachment of the pins to the aforesaid pattern and detachment of the package assembly from the temporary support of FIG. 4A, FIGS. 6C–6D being enlarged for sake of clarity.
Figure 6B:
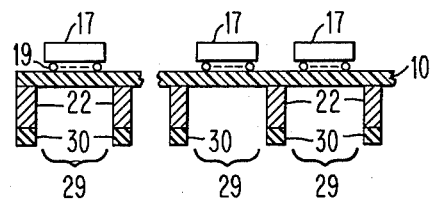

The next phase of the process involves affixing the heads 5 of pins 4 of pin carriers 2 to the polyimide layer 23. An etch resistant mask 30, cf. FIG. 6A, is applied to the outer surface of support 22. For the given materials example of member 22, mask 30 is a wax, such as the type manufactured by Shell Oil Company under the product name Apiezon, that is applied through a screen or stencil, not shown. As a result, a wax etchant mask 30 is formed on the outer surface of member 22 with cutouts or windows slightly larger than and beneath each assembly site 29 which includes within a pattern 11, cf. FIG. 6A. Member 22 is then etched through mask 30 using a suitable etchant. For example, hydrochloric acid can be used as an etchant for aluminum, and ferric chloride can be used for invar or Kovar. The etching is stopped when access to the polyimide layer 23 is reached, as shown in FIG. 6B.

Figure 6C:
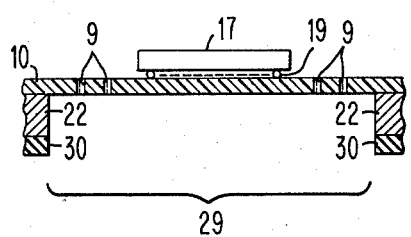
Figure 6D:
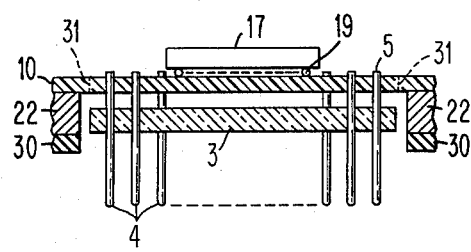

Holes 9 are then pierced by a heated piercing tool, not shown, in the polyimide layer 23 at each site 29 through the apertured lands 14 of member 10 which are arranged in the aforementioned two concentric rectangular arrays, cf. FIG. 6C. Next, the heads 5 of the pins 4 of pin carriers 2 are inserted through the holes 9 and the apertured lands 14 are solder bonded to their respective concentric lands 14, cf. FIG. 6D, via solder bonds 16. Next, the individual assemblies are cutout of or away from the support 22 by cutting the polyimide layer 23 along appropriate predetermined cutting lines, cf. for example, lines 31, FIG. 6D. Each assembly is then sealed in the container 21, as aforedescribed, cf. FIG. 1. Preferably, the container 21 is of a suitable thermal conductive material, such as aluminum or the like, and the chip 17 is then thermally backbonded to it by, for example, a solder bond 32, cf. FIG. 1. To this end the back of chip 17 may be presoldered and solder reflow bonded to effect the bond 32. In certain cases, the sealing of the cover 21 and/or backbonding of the chip 17 thereto can be effected while the polyimide layer 23 is still being supported by the remainder, i.e. unetched portions, of the support member 22.

It should be understood that in the Figures, the thickness dimensions of the member 10 and terminals 18 have been greatly exaggerated and enlarged with respect to the corresponding dimensions of base 3, chip 17 and support 22 for sake of clarity. Also for sake of clarity, in FIGS. 5, 6A–6D the printed circuit patterns 11 have been omitted.

The inventive method provides a highly reliable thin flexible interconnection, to wit: member 10, which mitigates the risk of damaging its polyimide substrate's flexibility and/or integrity characteristics and particularly in proximity to the bonding sites at the terminal 18-pad 15 interconnections, as well as the pin 4-land 14 interconnections. It is particularly useful for making electronic package assemblies which are subject to thermal cycle stresses and particularly where the chip is to be rigidly affixed to another structure such as the aforementioned backbonding of the chip 17 to the module cover 21 in the preferred embodiment and/or where the chip 17 and pin carrier base 3 have different thermal characteristics such as a silicon chip 17 and a ceramic base 3. The floating-like action of the interconnection between chip 17 and pin carrier 2 provided by flexible member 10 thus provides enhanced relief for stresses caused by thermal cycling.

In the aforedescribed embodiment, three levels 24, 25, 26 of metallization, to wit: chromium, copper, chromium are preferably employed for reasons previously explained. Generally, the chromium levels 24, 26 have thickness dimensions in the order of 700 Angstroms each and the copper layer 25 has a thickness dimension in the preferred range of 4 to 8 microns. For sake of clarity, in the Figures, the corresponding thickness dimensions have been exaggerated. It should be understood, however, that other thickness dimensions and/or other materials and/or other number of levels can be used for levels 24–26, as is obvious to those skilled in the art. Thus, for example, in certain applications only a single level of conductive material for forming the PC conductors can be used and with or without the use of solder stops.

Moreover, if desired, the polyimide layer can be first formed on the permanent conductive layer of a multilayer strippable manner such as peel-apart copper or etchapart copper. The outer surface of the polyimide layer so formed is then affixed to a temporary carrier such as panel 22 by, for example, a removable epoxy. The strippable layer of the multilayer strippable member is then removed leaving the remaining aforesaid permanent conductive layer for forming circuitry therewith into the desired printed circuit pattern. In such a case, the strippable layer and temporary support coact as a temporary support means.

While the invention has been particularly shown and described with reference to a preferred embodiment thereof, it will be understood by those skilled in the art that various changes in form and details may be made therein without departing from the spirit and scope of the invention.

We claim:

1. The method for making at least one electronic package assembly, said assembly having at least an insulator pin carrier member, plural conductive elongated pluggable pins carried by said member, each of said pins being extended through said member to provide first and second extensions past first and second surfaces, respectively, of said member, a thin flexible printed circuit conductive member having a polyimide substrate of a predetermined thickness of substantially 5 microns, a printed circuit pattern of plural conductors supported by said substrate, said first extensions being bonded to predetermined ones of said plural conductors, and at least one electronic circuit chip having input/output terminals bonded to preselected ones of said plural conductors, said method comprising the steps of:

providing temporary planar support means,
   forming an integral layer of uncured liquid polyimide on one surface of said support means sufficient to provide said predetermined thickness when said polyimide is subsequently cured,
   curing said polyimide layer,
   circuitizing the outer surface of said cured polyimide layer with said plural conductors of said predetermined circuit pattern,
   providing said insulator pin carrier member and said plural pins carried thereby,
   providing said electronic circuit chip,
   bonding said terminals of said chip to preselected ones of said conductors,
   selectably removing portions of said temporary support means from said polyimide layer,
   forming holes in said polyimide layer to said predetermined ones of said conductors,
   inserting said first extensions of said pins through said holes, and
   bonding said first extensions of said pins of said pin carrier member to said predetermined ones of said conductors.

2. The method according to claim 1 wherein said support means further comprises a panel of etchable material, and said step of selectably removing portions of said support means from said polyimide layer comprises etching away said portions with a compatible etchant through an etch resistance mask.

3. The method according to claim 1 wherein said step of bonding of said terminals to said preselected ones of said conductors comprises a controlled collapse chip connection process.

4. The method according to claim 1 further comprising the step of removing the remainder of said temporary support means from said polymer layer after said stop of bonding said first extensions of said pins of said pin carrier member to said predetermined ones of said conductors.

5. The method according to claim 1 further comprising the step of providing a rigid thermal backbond for said chip to a rigid thermal conductive member.

6. The method of claim 1 wherein said step of circuitizing comprises evaporating successive layers of chromium, copper and chromium on said polyimide layer, and forming said printed circuit pattern therein, and removing portions of said last mentioned chromium layer to provide first bonding sites on said copper layer for said chip terminals and second bonding sites on said copper layer for said pin first extensions, said printed circuit pattern providing an aperture through each of said second bonding sites through said evaporated layers.

7. The method according to claim 6 wherein the step of forming said holes on said polyimide layer comprises piercing said polyimide layer through said apertured bonding sites with heated piercing tool means prior to said step of bonding of said first extensions to said second bonding sites.

8. The method for making plural electronic package assemblies, each of said assemblies having a ceramic pin carrier member, plural conductive elongated pluggable pins carried by said member, each of said pins being extended through said member to provide first and second extensions past first and second surfaces, respectively, of said member, a thin flexible printed circuit conductive member having a polyimide substrate of a predetermined thickness of substantially 5 microns, a printed circuit pattern of plural conductors supported by said substrate, said first extensions being bonded to predetermined ones of said plural conductors, and at least one electronic circuit chip having a high density array of input/output terminals bonded to preselected ones of said plural conductors, each said chip being thermally backbonded to a rigid thermal conductive member, said method comprising the steps of:

providing a temporary planar support panel of etchable material,
   spraying an integral layer of uncured liquid polyimide on one surface of said support sufficient to provide said predetermined thickness when said polyimide is subsequently cured,
   drying said liquid polyimide layer,
   curing said dried polyimide layer, evaporating successive integral layers of chromium, copper and chromium on said polyimide layer, circuitizing said layers with plural said predetermined printed circuit patterns of plural conductors, removing first portions of said circuitized last mentioned chromium layer from said preselected ones of said conductors to provide first bonding sites for said chip terminals on said circuitized copper layer, and concurrently removing second portions of said circuitized last mentioned chromium layer from said predetermined ones of said conductors to provide second bonding sites for said first extensions of said pins on said circuitized copper layer, said printed circuit patterns providing an aperture at each of said second bonding sites through said evaporated layers, providing at least one said electronic circuit chip for each of said assemblies, bonding said terminals of each said chip to said first bonding sites of a mutually exclusive one of said plural circuit patterns by a controlled collapse chip connection process, selectively etching away with a compatible etchant third portions of said temporary support panel through an etchant mask to form plural accesses to the noncircuitized side of said polyimide layer, each of said accesses being larger than and beneath one of the printed circuit patterns to be included in each said assembly, piercing said polyimide layer through said apertured second bonding sites with a heated piercing tool, providing said ceramic pin carrier member and said plural conductive pins thereof for each of said assemblies, passing said first extensions of said pins of said pin carrier members through said pierced polyimide member and said apertured second bonding sites, solder reflow bonding said first extensions to said second bonding sites, selectively cutting the polyimide layer around each assembly site to separate the remainder of said temporary support panel therefrom, and thermally backbonding each of said chips to its associated said rigid thermal conductive member.

9. The method according to claim 8 wherein said step of thermal backbonding each of said chips occurs prior to said step of selectively cutting.

10. The method according to claim 9 wherein said step of drying takes place approximately at a temperature of 125° C. for 15 minutes, and said step of curing occurs approximately at an elevated temperature of 350° C. for approximately 5 minutes.

* * * * *